(12) United States Patent
Shreeve et al.

(10) Patent No.: US 11,942,940 B2
(45) Date of Patent: Mar. 26, 2024

(54) BOOT CAPACITOR CHARGE DURING LOW POWER STATES

(71) Applicant: Renesas Electronics America Inc., Milpitas, CA (US)

(72) Inventors: Aaron Shreeve, Austin, TX (US); Chun Cheung, Milpitas, CA (US); Michael Jason Houston, Cary, NC (US); Mehul Shah, Cary, NC (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/345,317

(22) Filed: Jun. 11, 2021

(65) Prior Publication Data

US 2022/0255537 A1    Aug. 11, 2022

Related U.S. Application Data

(60) Provisional application No. 63/146,230, filed on Feb. 5, 2021.

(51) Int. Cl.
*H03K 3/012* (2006.01)
*H03K 17/687* (2006.01)

(52) U.S. Cl.
CPC ......... *H03K 3/012* (2013.01); *H03K 17/6871* (2013.01); *H03K 2217/0063* (2013.01); *H03K 2217/0072* (2013.01)

(58) Field of Classification Search
CPC ............... H03K 3/012; H03K 17/6871; H03K 2217/0063; H03K 2217/0072
See application file for complete search history.

(56) References Cited

U.S. PATENT DOCUMENTS

| 7,205,917 | B2* | 4/2007 | Magrath | H03M 3/506 |
| | | | | 341/143 |
| 2011/0156669 | A1* | 6/2011 | Ishii | H02M 3/1588 |
| | | | | 323/271 |
| 2015/0077081 | A1* | 3/2015 | Ejury | H02M 3/158 |
| | | | | 327/109 |
| 2015/0303799 | A1* | 10/2015 | Tang | H02M 3/1584 |
| | | | | 323/271 |

* cited by examiner

*Primary Examiner* — Metasebia T Retebo
(74) *Attorney, Agent, or Firm* — SCULLY, SCOTT, MURPHY & PRESSER, P.C.

(57) ABSTRACT

Systems, apparatuses, and methods for charging a bootstrap capacitor of a device during low power states are described. In an example, an apparatus can include a controller configured to enable a low power state of the device. The device can include a high side switching element and a low side switching element. The controller can, in response to the low power state of the device being enabled, operate the low side switching element of the device to charge the bootstrap capacitor of the device. The controller can, in response to the low power state of the device being enabled and a level of a control signal being a first level, activate the low side switching element to charge the bootstrap capacitor of the device.

20 Claims, 5 Drawing Sheets

BOOT CAPACITOR CHARGE DURING LOW POWER STATES

CROSS-REFERENCE TO RELATED APPLICATIONS

This application claims the benefit of U.S. Provisional Application No. 63/146,230 filed on Feb. 5, 2021, the entire content of the provisional application is incorporated herein by reference.

BACKGROUND

The present disclosure relates in general to operations of power stages. More specifically, the present disclosure relates to operations of the power stages during low power state.

In some examples, a power stage can operate under a low power state to preserve energy and power. During low power state, various connection paths among components can be shut down or disconnected to minimize current flow, thus preserving energy and power. To transition from the lower power state back to normal operation state, the disconnected paths can be reconnected, and the power stage may need to be biased again. Further, the bootstrap voltage may need to be at a level sufficient for starting the normal operation state. The need to bias the power stage and to charge the bootstrap capacitor can delay the transition from low power state to normal operation state, causing undesired delay in the operations of the power stage.

SUMMARY

In some examples, an apparatus for charging a bootstrap capacitor of a device during low power states is generally described. The apparatus can include a controller. The controller can be configured to enable a low power state of a device, the device comprising a high side switching element and a low side switching element. The controller can be further configured to, in response to the low power state of the device being enabled, operate the low side switching element of the device to charge a bootstrap capacitor of the device.

In some examples, an apparatus for charging a bootstrap capacitor of a device during low power states is generally described. The apparatus can include a controller. The controller can be configured to send an enable signal to a device to enable a low power state of the device, the device comprises a high side switching element and a low side switching element. The controller can be further configured to in response to the low power state of the device being enabled, send a control signal to operate a low side switching element of the device to charge a bootstrap capacitor of the device.

In some examples, a system for charging a bootstrap capacitor of a device during low power states is generally described. The system can include a first device and a second device. The second device can be connected to the first device. The second device can include a high side switching element and a low side switching element. The first device can be configured to send an enable signal to the second device. The second device can be configured to receive the enable signal from the first device. The second device can be further configured to enable the low power state of the second device. In response to the low power state of the second device being enabled, the first device can be configured to send a control signal to the second device. In response to the low power state of the second device being enabled, the second device can be further configured to receive the control signal from the first device. In response to the low power state of the second device being enabled, the second device can be further configured to, based on a level of the control signal, operate the low side switching element of the second device to charge a bootstrap capacitor of the second device.

Further features as well as the structure and operation of various embodiments are described in detail below with reference to the accompanying drawings. In the drawings, like reference numbers indicate identical or functionally similar elements.

DETAILED DESCRIPTION

Figure 1:
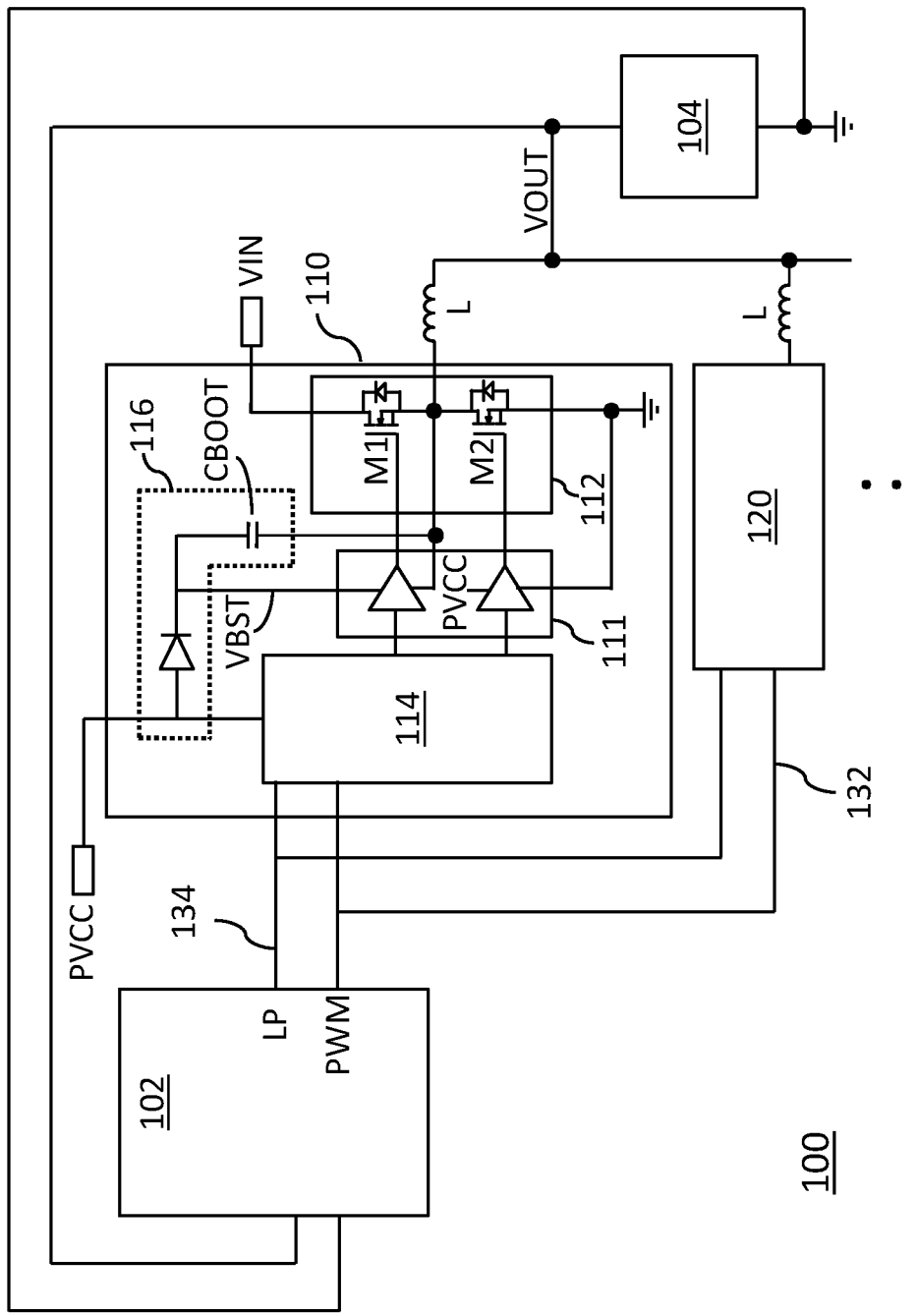
FIG. 1 is a diagram showing an example system that can implement boot capacitor charge during low power states in one embodiment.

FIG. 1 is a diagram showing an example system 100 that can implement boot capacitor charge during low power states in one embodiment. The system 100 can include a controller 102 and one or more devices including at least a device 110 and a device 120. In an example, the system 100 can be implemented as a power regulator that provides an output voltage VOUT for a load 104, where the power regulator can include a plurality of power stages (e.g., devices 110 and 120). The controller 102 can be a master device configured to control the devices 110 and 120. The devices 110 and 120 can be slave devices that can be current-sourced, voltage-sourced or devices implementing both current and voltage-sourced control. In an example, the devices 110 and 120 can be smart power stage (SPS) devices configured to perform voltage regulation on an input voltage VIN, with additional features such as temperature and current feedback control. In an example, the controller 102 may control additional devices in addition to the slave devices 110 and 120. It will be apparent to a person of ordinary skill in the art that the system 100 can include additional controllers and/or power stage devices.

The device 110 and the device 120 can include identical components and configured to perform the same functions. It will be apparent to a person of ordinary skill in the art that the descriptions of the device 110 herein are also applicable to the device 120. In an example, each device among the devices 110 and 120 can include its own power converter (e.g., DC-DC converter or buck converter). Using the device 110 as an example, the device 110 can include a power converter 112, where the power converter 112 can include a set of switching elements such as high side switching element M1 and a low side switching element M2. The switching elements M1 and M2 can be metal-oxide-semiconductor field-effect transistors (MOSFETs). In an example, switching elements M1 and M2 can be n-type MOSFETs. Each one of the devices 110 and 120 can further include a controller configured to receive signals from the controller 102 and operate its respective power converter. For example, the device 110 can include a controller 114 that can be configured to control various components within the device 110.

The device 110 can also include a bootstrap circuit 116, and the bootstrap circuit 116 can include a bootstrap capacitor CBOOT connected between a power supply PVCC and a driver 111 of the device 110. It will be apparent to a person of ordinary skill in the art that the bootstrap circuit 116 can include additional components. The bootstrap circuit 116 can be a step-up circuit in response to switching element M1 being a n-type MOSFET. The bootstrap circuit 116 can be configured to output a bootstrap voltage VBST, where VBST can be used for turning on the switching element M1. For example, when switching element M1 is turned off and switching element M2 is turned on, the bootstrap capacitor CBOOT in the bootstrap circuit 116 can be charged by the power supply PVCC, and when switching element M1 is turned on and switching element M2 is turned off, the bootstrap capacitor CBOOT in the bootstrap circuit 116 can be discharged causing an output of the bootstrap voltage VBST.

The power converters in the devices 110 and 120 can be controlled or driven by a control signal being transmitted by the controller 102 via a pulse width modulation (PWM) line 132. The control signal can be a PWM signal having at least two levels. In an example, the PWM signal can be a three level, or tri-level, PWM signal having three signal levels, such as low, mid, and high. The three levels of the PWM signal can be represented as, for example, +1, 0, and −1. It will be apparent to a person of ordinary skill in the art that the levels of a PWM signal can be represented by arbitrary values and/or signal amplitudes. The controller 114 can include PWM level detection circuits configured to detect a level of the PWM control signal being transmitted via the PWM line 132. Based on the detected level of the PWM control signal, the controller 114 can determine whether to turn on switching element M1, turn on switching element M2, or turn off both switching elements M1 and M2.

In an example, the low-level PWM signal turn on (e.g., activate or close) switching element M2 while keeping switching element M1 off, the high-level PWM signal can turn on (e.g., activate or close) switching element M1 while keeping switching element M2 off, and the mid-level PWM signal can turn off (e.g., deactivate or open) both switching elements M1 and M2. In another example, the low-level PWM signal can turn on switching element M1 while keeping switching element M2 off, the high-level PWM signal can turn on switching element M2 while keeping switching element M1 off, and the mid-level PWM signal can turn off both switching elements M1 and M2. It will be apparent to a person of ordinary skill in the art that the three levels of PWM signal can be assigned to turn on or turn off different switching elements in the power converter 112.

In response to turning on switching element M2 and turning off switching element M1, the bootstrap capacitor CBOOT in the bootstrap circuit 116 can be charged by a power rail or supply, labeled as PVCC, connected to the bootstrap capacitor CBOOT in the bootstrap circuit 116. In response to turning on switching element M1 and turning off switching element M2, the bootstrap capacitor CBOOT in the bootstrap circuit 116 can discharge its energy to drive the gate of switching element M1. To turn on switching element M1, the energy being discharged by the bootstrap capacitor CBOOT in the bootstrap circuit 116 needs to be at a level sufficient to provide a gate-source voltage VGS greater than a threshold voltage of switching element M1.

The controller 102 can be configured to activate or enable, and deactivate or disable, a low power state of the devices 110 and 120 via a low power (LP) line 134. In an example, the controller 102 can send an enable signal (e.g., a logic 1 signal) to the device 110 and the device 120 via the LP line 134 for enabling the low power state of the device 110. In another example, the controller 102 can send a disable signal (e.g., a logic 0 signal) to the device 110 via the LP line 134 for disabling the low power state of the device 110. When the low power state of the devices 110 and 120 is enabled, the devices 110 and 120 can operate under a low power state to preserve energy and power. During the low power state, various connection paths among components in the devices 110 and 120 can be shut down or disconnected, and/or various functions can be disabled, to minimize current flow within the devices 110 and 120, thus preserving energy and power. For example, if a particular component is not needed, the particular component can be shut down to preserve power during the low power state.

In an example, different levels of low power states can be enabled for the device 110. For example, the device 110 can operate under more than one level of low power state, such as a nap mode and a sleep mode. In an example, the nap mode can cause the device 110 to partially shut down and the sleep mode can cause the device 110 to shut down relatively more components when compared to the nap mode. In an example, the nap mode can reduce power dissipation of the device 110 to less than a first amount of power and may recover to normal operation within a first amount of time. The sleep mode can reduce power dissipation of the device 110 to less than a second amount of power, where the second amount of power is less than the first amount of power, but may require a second amount of time to recover from the sleep mode, where the second amount of time is more than the first amount of time. It will be apparent to a person of ordinary skill in the art that the methods and apparatus being described herein can be applicable to different modes of low power state of a power stage and/or other types of electronic devices, providing that the components necessary for performing the methods described herein are not shut down. Further, different low power states can be enabled or disabled using different LP lines. For example, the nap mode of the devices 110 and 120 can be enabled or disabled using signals being sent on the LP line 134, while the sleep mode of the device 110 and 120 can be enabled or disabled using another LP line that can be different from the LP line 134.

To transition from the low power state back to normal operation state, the disconnected paths can be reconnected, and the device 110 may need to go through a start-up process. In an example, the start-up process of the device 110 may include biasing various components, turning on switching element M1, etc. Thus, the bootstrap voltage being provided by the bootstrap circuit 116 may need to be at a level sufficient for turning on switching element M1 to allow the device 110 to resume operation in the normal operation state. The transition time from the low power state to the normal operation state can be referred to as wake-up time (or in some other instances, recovery time). The wake-up time can include the time to ensure the bootstrap capacitor CBOOT in the bootstrap circuit 116 is sufficiently charged in order for the bootstrap circuit 116 to provide a sufficient level of VBST to turn on switching element M1. Therefore, if the bootstrap capacitor CBOOT in the bootstrap circuit 116 is not charged sufficiently, the wake-up time may increase causing a delay in the transition from the low power state to the normal operating state.

The system 100 shown in FIG. 1 can allow the bootstrap capacitor CBOOT in the bootstrap circuit 116 to be charged when the device 110 is in a specific low power state where certain components in the device 110 can remain active (e.g., a nap mode). For example, under the nap mode, the controller 114 can be programmed to turn on and turn off switching element M2, but not turn on switching element M1, based on the control signal being sent on the PWM line 132. For example, under the nap mode, the controller 114 can be programmed to maintain switching element M1 in a deactivated state, and maintain a current state of switching element M2 (e.g., not interrupting operations of switching element M2) in response to receiving a mid-level PWM signal or other levels of PWM indicating to turn off both switching elements M1 and M2. In other words, the controller 114 can still receive a PWM control signal from the controller 102, but may not react to all levels of the PWM control signal. By allowing the controller 114 to turn on switching element M2 during the nap mode, while not reacting to other levels of the PWM control signal, the bootstrap capacitor CBOOT in the bootstrap circuit 116 can be charged while allowing the device 110 to remain in a low power state that preserves power. For example, the controller 114 may not need to consume additional power to pull an output voltage of the driver 111 to a mid-level voltage in response to receiving a mid-level PWM control signal.

Figure 2:
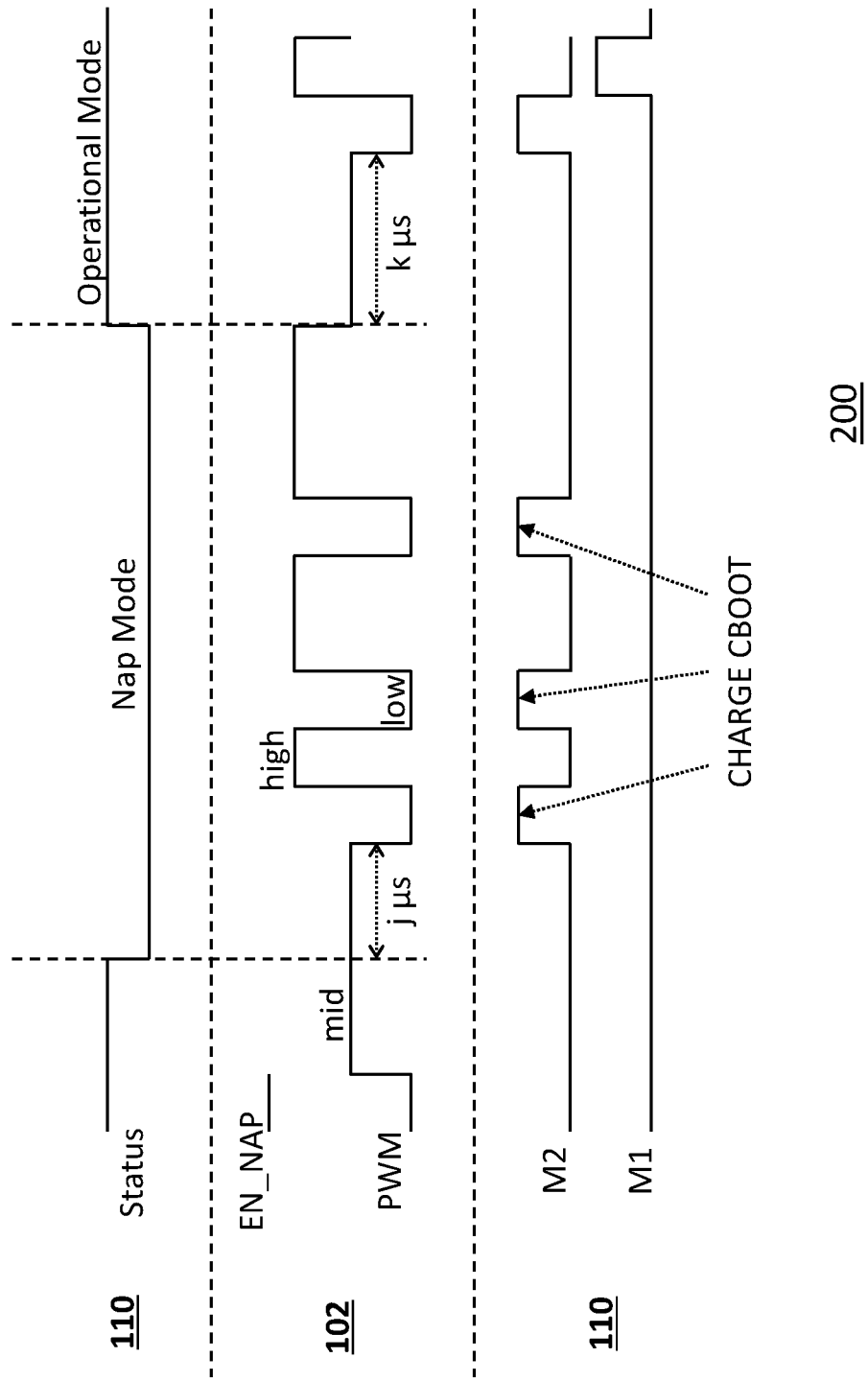
FIG. 2 is a diagram showing a timing diagram of an example implementation of boot capacitor charge during low power states in one embodiment.

FIG. 2 is a diagram showing a timing diagram 200 of an example implementation of boot capacitor charge during low power states, that can be performed by the system 100 shown in FIG. 1, in one embodiment. The timing diagram 200 shows a "Status" that indicates whether the device 110 is in a low power state (e.g., nap mode) or an operational mode (e.g., a normal operation mode). The "EN_NAP" signal can represent an enable signal being transmitted from the controller 102 to the device 110 via the LP line 134. In the timing diagram 200, the EN_NAP signal can be a logic low signal to activate the nap mode of the device 110. It will be apparent to a person of ordinary skill in the art that some systems may activate the nap mode based on the EN_NAP signal being a logic high signal, or other levels, as well. The PWM signal shown in the timing diagram 200 can be the control signal being transmitted from the controller 102 to the device 110 via the PWM line 132. In the example shown in FIG. 2, the PWM signal is a three level PWM signal that can have a low-level, a mid-level, and a high-level.

The switching elements M1 and M2 can be activated or deactivated based on the levels of the PWM signal. In the timing diagram shown in FIG. 2, during the operational mode, a low-level PWM signal can activate switching element M2 and deactivate switching element M1, a high-level PWM signal can activate switching element M1 and deactivate switching element M2, and a mid-level PWM signal can deactivate both switching elements M1 and M2. The controller 114 can be configured to selectively react to different levels of the PWM signal during nap mode. For example, the controller 114 can be configured to disable current that is required for high impedance sensing on the PWM input of the device 110. Thus, during nap mode, the controller 114 of the device 110 can continue to operate switching element M2 during nap mode, but may ignore the high-level PWM signal in order to avoid using power to operate switching element M1. The timing diagram 200 can be a result of an implementation of the system 100 where default states of switching elements M1 and M2 are logic high.

As shown in the timing diagram 200, during nap mode, the device 110 can continue to activate switching element M2 (M2 signal driven to logic high) in response to the PWM signal being a low-level PWM signal. Also, during nap mode, in response to receiving a high-level PWM signal, the controller 114 of the device 110 can maintain switching element M1 in a deactivated or off state. The device 110 can also deactivate switching element M2 (M2 signal driven to logic low) in response to the PWM signal being a high-level PWM signal during nap mode. In other words, during nap mode, the device 110 can operate switching element M2 as if the status is under the operational mode. By being able to operate switching element M2 during nap mode, the bootstrap capacitor CBOOT of the device 110 can be charged during nap mode, and the bootstrap voltage of the device 110 can also be refreshed. Further, by configuring the controller 114 to operate switching element M2 under normal operation mode, and configuring the controller 114 to not operate switching element M1 based on the PWM signal, the bootstrap capacitor CBOOT of the device 110 can be charged during nap mode as the nap mode preserves power for the device 110.

In an example, the controller 102 can be also configured to implement the charging of the bootstrap capacitor CBOOT during nap mode. For example, as shown in the timing diagram 200, the controller 102 can be configured to send a mid-level PWM signal in response to sending the EN_NAP signal. The controller 102 can send the mid-level PWM signal to the device 110 prior to the nap mode being enabled by the device 110. The controller 102 can send the mid-level PWM signal to allow the device 110 to stabilize the voltages being outputted by the driver 111 and to ensure that switching elements M1 and M2 are deactivated or turned off as the nap mode begins, and to avoid creating unwanted signals being outputted by the driver 111 to switching elements M1 and M2. The controller 102 can send the mid-level PWM signal having a pulse width equivalent to a transmission time from the controller 102 to the device 110 and a hand off time of, for example, j microseconds (µs) to ensure that there is sufficient time to turn off switching elements M1 and M2. After a lapse of the hand off time of j µs, the controller 102 can send high-level and low-level PWM signals alternatively for the device 110 to operate switching element M2 to charge the bootstrap capacitor. Therefore, the controller 102 can be configured to output two-level PWM signal having high level and low level, without the mid-level, during the nap mode.

To transition from the nap mode to the operational mode, the controller 102 can send a disable signal (e.g., logic high for the EN_NAP signal) to the device 110. In response to sending the disable signal, the controller 102 can send the mid-level PWM signal to allow the device 110 to stabilize the voltages being outputted by the driver 111 and to ensure that switching elements M1 and M2 are deactivated or turned off before resuming the operational mode. The controller 102 can send the mid-level PWM signal having a pulse width equivalent to a transmission time from the controller 102 to the device 110 and a hand off time of, for example, k µs, to ensure that there is sufficient time to turn off switching elements M1 and M2 and to avoid creating unwanted signals being outputted by the driver 111 to switching elements M1 and M2. The values of the hand off time j and k can be arbitrary, can be the same, or can be different from one another, depending on a desired implementation of the system 100. After a lapse of the hand off time of k μs, the controller 102 can control the device 110 according to the operational model of the device 110.

Figure 3:
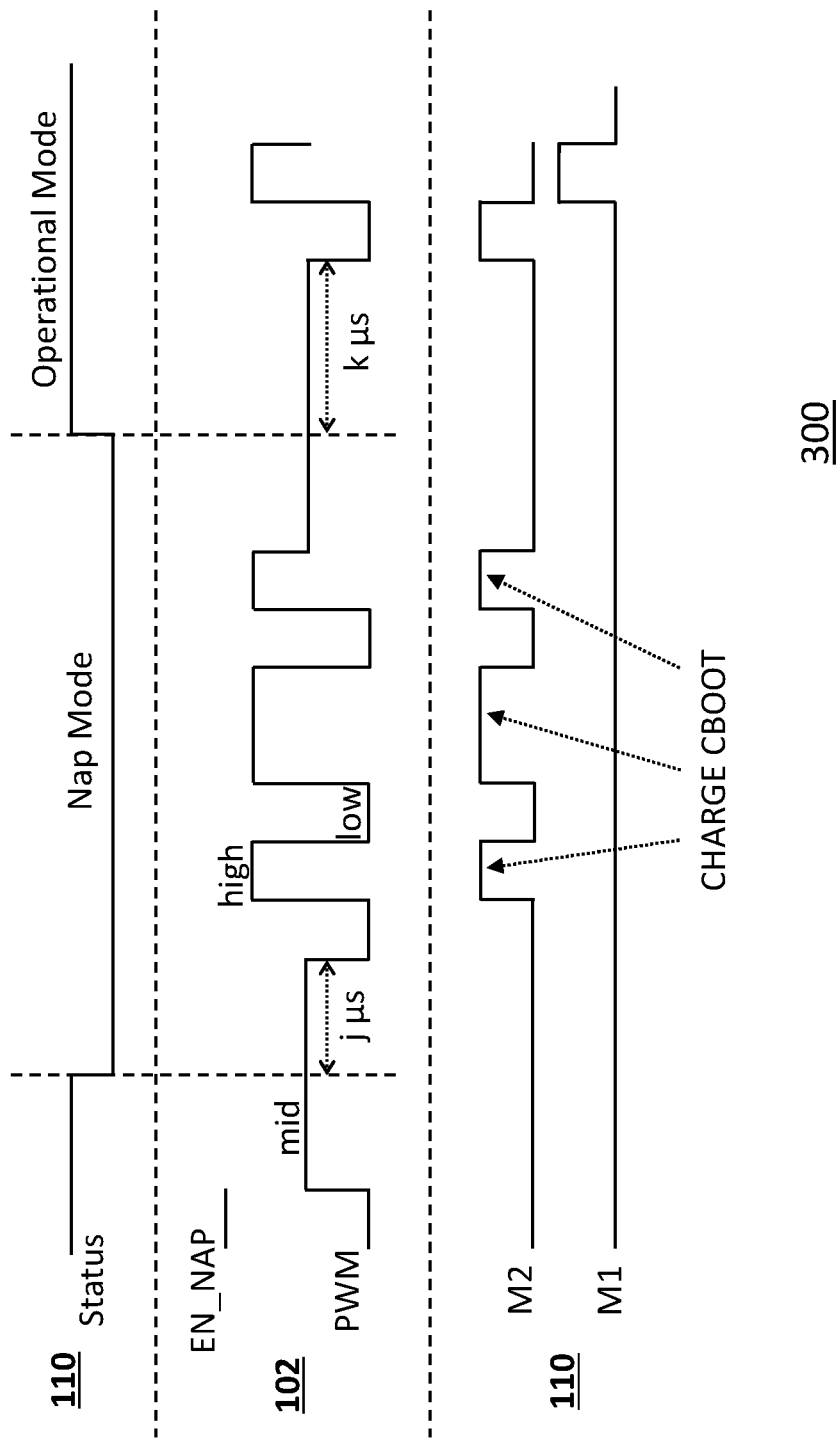
FIG. 3 is a diagram showing another timing diagram of an example implementation of boot capacitor charge during low power states in one embodiment.

FIG. 3 is a diagram showing another timing diagram 300 of another example implementation of boot capacitor charge during low power states, that can be performed by the system 100 shown in FIG. 1, in one embodiment. The timing diagram 300 shows a "Status" that indicates whether the device 110 is in a low power state (e.g., nap mode) or an operational mode (e.g., a normal operation mode). The "EN_NAP" signal can represent an enable signal being transmitted from the controller 102 to the device 110 via the LP line 134. In the timing diagram 300, the EN_NAP signal can be a logic low signal to activate the nap mode of the device 110. It will be apparent to a person of ordinary skill in the art that some systems may activate the nap mode based on the EN_NAP signal being a logic high signal, or other levels, as well. The PWM signal shown in the timing diagram 300 can be the control signal being transmitted from the controller 102 to the device 110 via the PWM line 132. In the example shown in FIG. 2, the PWM signal is a three level PWM signal that can have a low-level, a mid-level, and a high-level.

The switching elements M1 and M2 can be activated or deactivated based on the levels of the PWM signal. In the timing diagram shown in FIG. 2, during the operational mode, a high-level PWM signal can activate switching element M2 and deactivate switching element M1, a low-level PWM signal can activate switching element M1 and deactivate switching element M2, and a mid-level PWM signal can deactivate both switching elements M1 and M2. The controller 114 can be configured to selectively react to different levels of the PWM signal during nap mode. Thus, during nap mode, the controller 114 of the device 110 can continue to operate switching element M2 during nap mode, but may ignore the high-level PWM signal in order to avoid using power to operate switching element M1. The timing diagram 300 can be a result of an implementation of the system 100 where default states of switching elements M1 and M2 are logic low, and where the device 110 can include pull down resistors incorporated with floating PWM outputs during the nap mode.

As shown in the timing diagram 300, during nap mode, the device 110 can continue to activate switching element M2 (M2 signal driven to logic high) in response to the PWM signal being a high-level PWM signal. Also, during nap mode, in response to receiving a low-level PWM signal, the controller 114 of the device 110 can maintain switching element M1 in a deactivated or off state. The device 110 can also deactivate switching element M2 (M2 signal driven to logic low) in response to the PWM signal being a low-level PWM signal during nap mode. In other words, during nap mode, the device 110 can operate switching element M2 as if the status is under the operational mode. By being able to operate switching element M2 during nap mode, the bootstrap capacitor CBOOT of the device 110 can be charged during nap mode, and the bootstrap voltage of the device 110 can also be refreshed. Further, by configuring the controller 114 to operate switching element M2 under normal operation mode, and configuring the controller 114 to not operate switching element M1 based on the PWM signal, the bootstrap capacitor CBOOT of the device 110 can be charged during nap mode as the nap mode preserves power for the device 110.

In an example, the controller 102 can be also configured to implement the charging of the bootstrap capacitor CBOOT during nap mode. For example, as shown in the timing diagram 300, the controller 102 can be configured to send a mid-level PWM signal in response to sending the EN_NAP signal. The controller 102 can send the mid-level PWM signal to the device 110 prior to the nap mode being enabled by the device 110. The controller 102 can send the mid-level PWM signal to allow the device 110 to stabilize the voltages being outputted by the driver 111 and to ensure that switching elements M1 and M2 are deactivated or turned off as the nap mode begins, and to avoid creating unwanted signals being outputted by the driver 111 to M1 and M2. The controller 102 can send the mid-level PWM signal having a pulse width equivalent to a transmission time from the controller 102 to the device 110 and a hand off time of, for example, j microseconds (μs) to ensure that there is sufficient time to turn off switching elements M1 and M2. After a lapse of the hand off time of j μs, the controller 102 can send high-level and low-level PWM signals alternatively for the device 110 to operate switching element M2 to charge the bootstrap capacitor. Therefore, the controller 102 can be configured to output two-level PWM signal having high level and low level, without the mid-level, during the nap mode.

To transition from the nap mode to the operational mode, the controller 102 can send a disable signal (e.g., logic high for the EN_NAP signal) to the device 110. In response to sending the disable signal, the controller 102 can send the mid-level PWM signal to allow the device 110 to stabilize the voltages being outputted by the driver 111 and to ensure that switching elements M1 and M2 are deactivated or turned off before resuming the operational mode. The controller 102 can send the mid-level PWM signal having a pulse width equivalent to a transmission time from the controller 102 to the device 110 and a hand off time of, for example, k μs, to ensure that there is sufficient time to turn off switching elements M1 and M2 and to avoid creating unwanted signals being outputted by the driver 111 to switching elements M1 and M2. The values of the hand off time j and k can be arbitrary, can be the same, or can be different from one another, depending on a desired implementation of the system 100. After a lapse of the hand off time of k μs, the controller 102 can control the device 110 according to the operational model of the device 110.

Figure 4:
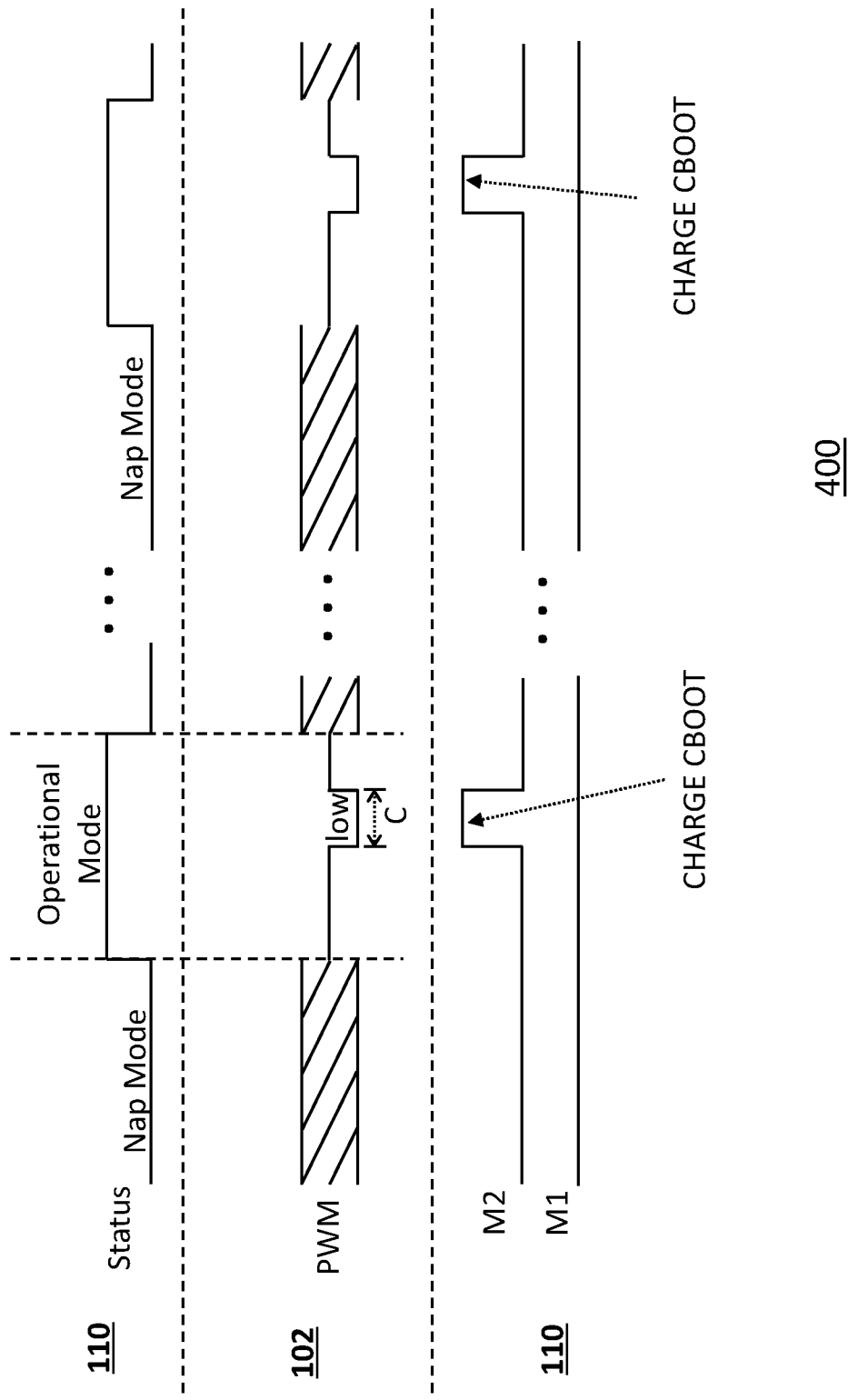
FIG. 4 is a diagram showing another timing diagram of an example implementation of boot capacitor charge during low power states in one embodiment.

FIG. 4 is a diagram showing another timing diagram 400 of another example implementation of boot capacitor charge during low power states, that can be performed by the system 100 shown in FIG. 1, in one embodiment. The timing diagram 400 shows a "Status" that indicates whether the device 110 is in a low power state (e.g., nap mode) or an operational mode (e.g., a normal operation mode). An enable signal for controlling the activation and deactivation of the nap mode can be transmitted from the controller 102 to the device 110 via the LP line 134. In the timing diagram 400, the enable signal can be a logic low signal to activate the nap mode of the device 110. It will be apparent to a person of ordinary skill in the art that some systems may activate the nap mode based on the enable signal being a logic high signal, or other levels, as well. The PWM signal shown in the timing diagram 400 can be the control signal being transmitted from the controller 102 to the device 110 via the PWM line 132. In the example shown in FIG. 2, the PWM signal is a three level PWM signal that can have a low-level, a mid-level, and a high-level.

The switching elements M1 and M2 can be activated or deactivated based on the levels of the PWM signal. In the timing diagram 400 shown in FIG. 4, during the operational mode, a low-level PWM signal can activate M2 and deactivate switching element M1, a high-level PWM signal can activate switching element M1 and deactivate switching element M2, and a mid-level PWM signal can deactivate both switching elements M1 and M2. In an example, the nap mode of the device 110 may be a low power state where circuits configured to detect and interpret PWN signals are disabled or shut down. Therefore, the controller 102 can be configured to control charging of the bootstrap capacitor CBOOT of the device 110 in response to the nap mode of the device 110 being enabled.

In an example, as shown in the timing diagram 400, the controller 102 may not be able to send any PWM signal to the device 110 during the nap mode. For example, the connections between the PWM input pin of the device 110 and other components of the device 110 can be disconnected. Therefore, during nap mode of the device 110, the controller 102 can be configured to periodically disable the nap mode of the device 110 by periodically sending a disable signal to the device 110. In response to sending the disable signal, the controller 102 can send a mid-level PWM signal to turn off switching elements M1 and M2, then a low-level PWM signal (or high-level PWM signal, depending on whether switching element M2 activates by logic high or logic low) to turn on switching element M2. Thus, the bootstrap capacitor CBOOT of the device 110 can be charged periodically. In an example, the bootstrap capacitor CBOOT of the device 110 can be charged for a predetermined amount of time (labeled as t) that can be defined by a pulse width of, for example, the low-level PWM signal shown in the timing diagram 400. The controller 102 can send the mid-level PWM signal to the device 110 once again to turn off switching elements M1 and M2 before sending another enable signal to put the device 110 into nap mode once again. By allowing the controller 102 to exit the nap mode periodically, devices that goes into a low power state (nap mode or sleep mode) where PWM detection and interpretation circuits are shut off can charge their bootstrap capacitors during low power state.

Figure 5:
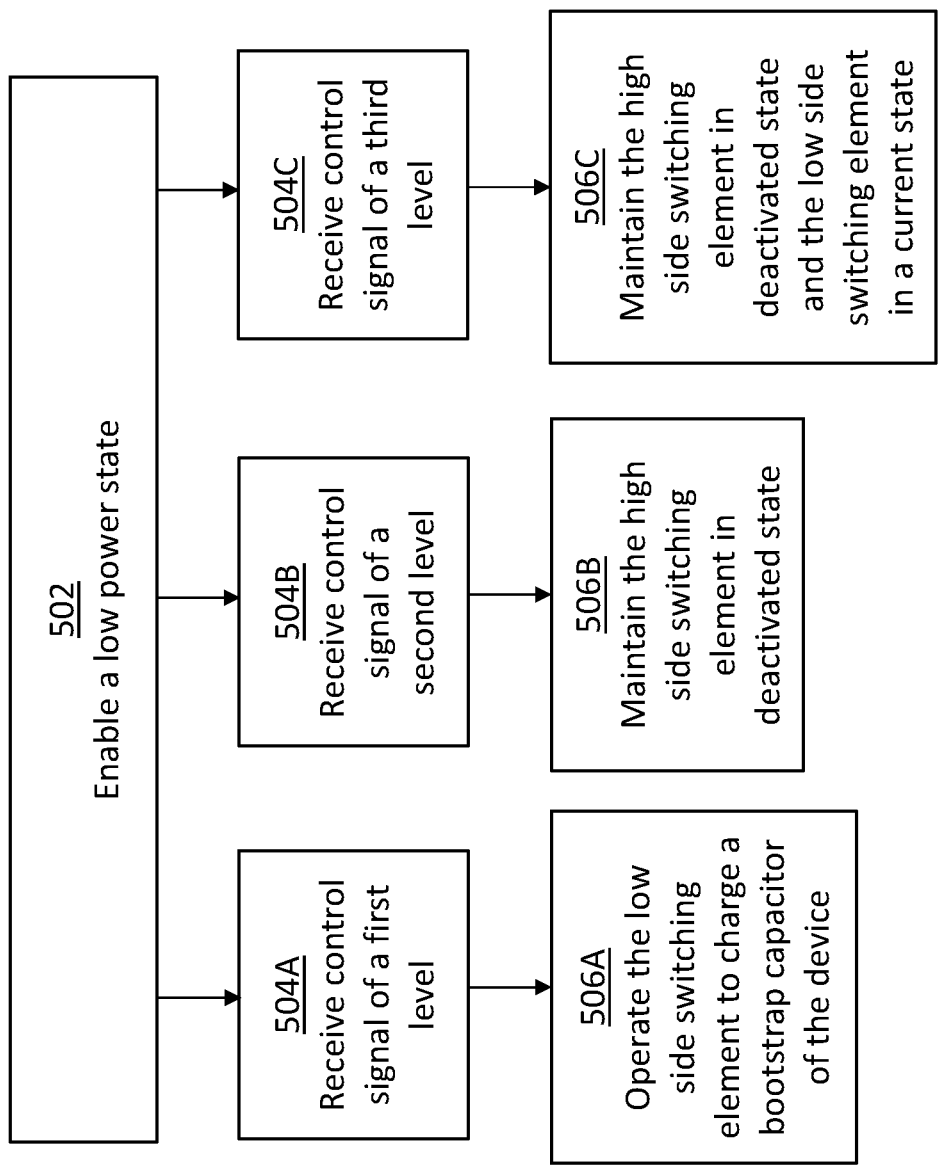
FIG. 5 is a flow diagram illustrating a process to implement boot capacitor charge during low power states in one embodiment.

FIG. 5 is a flow diagram illustrating a process 500 to implement boot capacitor charge during low power states in one embodiment. The process can include one or more operations, actions, or functions as illustrated by one or more of blocks 502, 504A, 504B, 504C, 506A, 506B, and/or 506C. Although illustrated as discrete blocks, various blocks can be divided into additional blocks, combined into fewer blocks, eliminated, or performed in parallel, depending on the desired implementation.

The process 500 can begin at block 502. At block 502, a device (e.g., device 110 or device 120 shown in FIG. 1) can enable a low power state. The device can include a high side switching element and a low side switching element. In an example, the device can deactivate the high side switching element and the low side switching element prior to enabling the low power state of the device. The process 500 can proceed from block 502 to one of block 504A, 504B, and 504C.

At block 504A, the device can receive a PWM control signal of a first level. The process 500 can proceed from block 504A to block 506A. At block 506A, in response to receiving the PWM control signal of the first level, the device can operate the low side switching element to charge a bootstrap capacitor of the device.

At block 504B, the device can receive a PWM control signal of a second level. The process 500 can proceed from block 504B to block 506B. At block 506B, in response to receiving the PWM control signal of the second level, the device can maintain the high side switching element in deactivated state.

At block 504C, the device can receive a PWM control signal of a third level. The process 500 can proceed from block 504C to block 506C. At block 506C, in response to receiving the PWM control signal of the third level, the device can maintain the high side switching element in deactivated state and maintain the low side switching element in a current state.

In an example, the device can disable the low power state of the device. In response to the low power state of the device being disabled, the device can deactivate the high side switching element and the low side switching element. The device can resume a normal operation state of the device in response to the deactivation of the high side switching element and the low side switching element.

In an example, the device can periodically disable the low power state of the device. In response to the low power state of the device being disabled, the device can operate the low side switching element of the device to charge the bootstrap capacitor of the device for a predetermined amount of time. In response to the bootstrap capacitor of the device being charged for the predetermined amount of time, the device can enable the low power state of the device to resume the low power state of the device.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a controller configured to:
   detect a signal level of a three-level pulse width modulation (PWM) control signal, wherein the signal level varies among a low level, a middle level, and a high level;
   enable a low power state of a device, the device comprising a high side switching element and a low side switching element driven by the three-level PWM control signal;
   detect a lapse of a hand off time, wherein the hand off time is a duration in which the middle level of the three-level PWM control signal is sustained during the low power state of the device; and
   in response to the detection of the lapse of the hand off time during the low power state of the device, and in response to the three-level PWM control signal transitioning to the low level during the low power state of the device, use the three-level PWM control signal to activate the low side switching element to charge a bootstrap capacitor of the device during the low power state of the device.

2. The apparatus of claim 1, wherein the controller is configured to:
   in response to the level of the three-level PWM control signal transitioning from the low level to the middle level, deactivate the low side switching element to refresh a bootstrap voltage of a bootstrap circuit comprising the bootstrap capacitor.

3. The apparatus of claim 1, wherein the controller is configured to:
   in response to the signal level of the three-level PWM control signal being the middle level, maintain the high side switching element in a deactivated state.

4. The apparatus of claim 1, wherein the controller is configured to:
   in response to the signal level of the three-level PWM control signal being the high level during the low power state, maintain current states of the high side switching element and the low side switching element.

5. The apparatus of claim 1, wherein the controller is configured to:
   deactivate the high side switching element and the low side switching element prior to the low power state of the device being enabled.

6. The apparatus of claim 1, wherein the controller is configured to:
   disable the low power state of the device;
   in response to the low power state of the device being disabled, deactivate the high side switching element and the low side switching element; and
   resume a normal operation state of the device in response to the deactivation of the high side switching element and the low side switching element.

7. The apparatus of claim 1, wherein in response to the low power state of the device being enabled, the controller is configured to, periodically:
   disable the low power state of the device;
   in response to the low power state of the device being disabled, operate the low side switching element of the device to charge the bootstrap capacitor of the device for a predetermined amount of time; and
   in response to the bootstrap capacitor of the device being charged for the predetermined amount of time, enable the low power state of the device.

8. An apparatus comprising:
   a controller configured to:
   send an enable signal to a device to enable a low power state of the device, the device comprises a high side switching element and a low side switching element;
   in response to the low power state of the device being enabled, send a three-level pulse width modulation (PWM) control signal to the device to drive the high side switching element and the low side switching element, wherein the three-level PWM control signal varies among a low level, a middle level, and a high level;
   detect a lapse of a hand off time, wherein the hand off time is a duration in which the middle level of the three-level PWM control signal is sustained during the low power state of the device; and
   in response to the detection of the lapse of the hand off time during the low power state of the device, use the three-level PWM control signal to operate a low side switching element of the device to charge a bootstrap capacitor of the device during the low power state of the device.

9. The apparatus of claim 8, wherein the controller is configured to:
   send the three-level PWM control signal at a low level to activate the low side switching element of the device to charge the bootstrap capacitor of the device; and
   send the three-level PWM control signal at middle level to deactivate the low side switching element to refresh a bootstrap voltage of a bootstrap circuit comprising the bootstrap capacitor.

10. The apparatus of claim 8, wherein the controller is configured to:
    send the three-level PWM control signal at the middle level to deactivate high side switching element and the low side switching element of the device prior to the low power state of the device being enabled.

11. The apparatus of claim 8, wherein the controller is configured to:
    send a disable signal to disable the low power state of the device;
    in response to the low power state of the device being disabled, send the three-level PWM control signal at the middle level to deactivate the high side switching element and the low side switching element of the device; and
    control the device in accordance with a normal operation state of the device.

12. The apparatus of claim 8, wherein in response to the low power state of the device being enabled, the controller is configured to, periodically:
    send a disable signal to disable the low power state of the device;
    in response to the low power state of the device being disabled, send the three-level PWM control signal to operate the low side switching element of the device to charge the bootstrap capacitor of the device for a predetermined amount of time; and
    in response to the bootstrap capacitor of the device being charged for the predetermined amount of time, send the enable signal to the device to enable the low power state of the device.

13. A system comprising:
    a first device;

a second device connected to the first device, the second device comprises a high side switching element and a low side switching element;

the first device is configured to send an enable signal to the second device;

the second device is configured to:
  receive the enable signal from the first device; and
  enable a low power state of the second device;

in response to the low power state of the second device being enabled:
  the first device is configured to send a three-level pulse width modulation (PWM) control signal to the second device to drive the high side switching element and the low side switching element, wherein the three-level PWM control signal varies among a low level, a middle level, and a high level;
  the second device is further configured to:
    receive the three-level PWM control signal from the first device;
    detect a lapse of a hand off time, wherein the hand off time is a duration in which the middle level of the three-level PWM control signal is sustained during the low power state of the device; and
    in response to the detection of the lapse of the hand off time during the low power state of the device, and in response to the three-level PWM control signal transitioning to the low level during the low power state of the device, use the three-level PWM signal to activate the low side switching element of the second device to charge a bootstrap capacitor of the second device during the low power state of the device.

14. The system of claim 13, wherein the second device is configured to:
  in response to the three-level PWM control signal having a signal level at the middle level:
    maintain the high side switching element in a deactivated state; and
    deactivate the low side switching element to refresh a bootstrap voltage of a bootstrap circuit comprising the bootstrap capacitor; and
  in response to the three-level PWM control signal having a signal level at the high level, maintain current state of the high side switching element and the low side switching element.

15. The system of claim 13, wherein the first device is configured to:
  send a disable signal to disable the low power state of the second device;
  in response to the low power state of the second device being disabled, send the three-level PWM control signal at the middle level to deactivate the high side switching element and the low side switching element of the second device; and
  control the second device in accordance with a normal operation state of the second device.

16. The system of claim 13, wherein in response to the low power state of the second device being enabled, the first device is configured to, periodically:
  send a disable signal to disable the low power state of the second device;
  in response to the low power state of the second device being disabled, send the three-level PWM control signal to operate the low side switching element of the second device to charge the bootstrap capacitor of the second device for a predetermined amount of time; and
  in response to the bootstrap capacitor of the device being charged for the predetermined amount of time, send the enable signal to the second device to enable the low power state of the second device.

17. The apparatus of claim 1, wherein the controller is further configured to disable an activation of the high side switching element while the device is in the low power state.

18. The apparatus according to claim 6, wherein the normal operation state of the device is resumed in response to the high side switching element and the low side switching element being deactivated for a predetermined amount of time.

19. The system of claim 13, wherein the second device is further configured to disable an activation of the high side switching element while the second device is in the low power state.

20. The system of claim 13, wherein the first device is further configured to disable an activation of the high side switching element while the second device is in the low power state.

* * * * *